US007693076B2

(12) United States Patent
Karam

(10) Patent No.: US 7,693,076 B2
(45) Date of Patent: Apr. 6, 2010

(54) DETECTION ALGORITHM FOR DELIVERING INLINE POWER DOWN FOUR PAIRS OF AN ETHERNET CABLE TO A SINGLE POWERED DEVICE

(75) Inventor: Roger Karam, Mountain View, CA (US)

(73) Assignee: Cisco Technology, Inc., San Jose, CA (US)

( * ) Notice: Subject to any disclaimer, the term of this patent is extended or adjusted under 35 U.S.C. 154(b) by 1321 days.

(21) Appl. No.: 11/058,963

(22) Filed: Feb. 15, 2005

(65) Prior Publication Data

US 2009/0228721 A1 Sep. 10, 2009

(51) Int. Cl.
*H04L 12/26* (2006.01)
(52) U.S. Cl. ............................. 370/241; 370/463
(58) Field of Classification Search .............. 370/445, 370/241, 242, 243, 245, 252, 241.1, 244, 370/246, 247, 248, 249, 250, 251, 255; 713/300, 713/310, 340; 307/126, 127, 128; 375/257, 375/258; 709/220, 200, 221, 222, 227; 324/76.11, 324/628, 612, 613, 614, 620, 627; 379/413
See application file for complete search history.

(56) References Cited

U.S. PATENT DOCUMENTS

| | | | | |
|---|---|---|---|---|
| 5,532,603 A | * | 7/1996 | Bottman | 324/628 |
| 5,586,111 A | * | 12/1996 | Wise | 370/241 |
| 5,629,628 A | * | 5/1997 | Hinds et al. | 324/628 |
| 6,175,865 B1 | * | 1/2001 | Dove et al. | 709/220 |
| 6,433,558 B1 | * | 8/2002 | Sciacero et al. | 324/628 |
| 6,650,622 B1 | | 11/2003 | Austerman, III et al. | 370/241 |
| 6,829,223 B1 | * | 12/2004 | Richardson et al. | 370/241 |
| 6,898,185 B1 | * | 5/2005 | Agazzi et al. | 370/241 |
| 6,982,560 B2 | * | 1/2006 | Pandya et al. | 324/628 |
| 7,068,611 B2 | * | 6/2006 | Bui | 370/252 |
| 2004/0260794 A1 | | 12/2004 | Ferntz et al. | |

OTHER PUBLICATIONS

IEEE Draft P802.3AF/D4.3, Amendment: Data Terminal Equipment (DTE) Power via Media Dependent Interface (MDI), Institute of Electrical and Electronics Engineers, Inc., 132 pages, Apr. 2003.

(Continued)

*Primary Examiner*—Kwang B Yao
*Assistant Examiner*—Alex Skripnikov
(74) *Attorney, Agent, or Firm*—Patterson & Sheridan, LLP

(57) ABSTRACT

Methods and apparatus for determining that all conductors of an Ethernet connection are connected to the same powered device (PD). In one disclosed embodiment, it is first determined that a signal conductor pair of the Ethernet connection is coupled to a valid PD according to a discovery process, and the unused conductor pair of the Ethernet connection is also coupled to a valid PD. However, it is not yet determined whether they are both coupled to the same PD. This disclosure provides for injecting a polluting signal into one of the conductor pairs, and performing the discovery process on the other conductor pair. If the discovery process fails on the other conductor pair as a result of the polluting signal, then it is determined that both of the conductor pairs are indeed coupled to same PD.

28 Claims, 12 Drawing Sheets

OTHER PUBLICATIONS

PCT/US06/04825 IPER dated Aug. 3, 2007 of corresponding patent application U.S. Appl. No. 11/058,963, filed Feb. 15, 2005; pp. 1-9.
Mendelson, Galit, All you need to know about Power Over Ethernet (PoE) and the 802.3af Standard; Jun. 2004), Retrieved from the internet Apr. 29, 2007; http://www.powerdsine.com/Documentation/WhitePapers/PoE_and_IEEE802_3af.pdf, pp. 1-24.

* cited by examiner

DETECTION ALGORITHM FOR DELIVERING INLINE POWER DOWN FOUR PAIRS OF AN ETHERNET CABLE TO A SINGLE POWERED DEVICE

FIELD OF THE INVENTION

The present invention relates generally to networking equipment that is powered by and/or powers other networking equipment over wired data telecommunications network connections.

BACKGROUND OF THE INVENTION

Inline Power (also known as Power over Ethernet and PoE) is a technology for providing electrical power over a wired telecommunications network from power source equipment (PSE) to a powered device (PD) over a link section. The power may be injected by an endpoint PSE at one end of the link section or by a midspan PSE along a midspan of a link section that is distinctly separate from and between the medium dependent interfaces (MDIs) to which the ends of the link section are electrically and physically coupled.

PoE is defined in the IEEE (The Institute of Electrical and Electronics Engineers, Inc.) Standard Std 802.3af-2003 published 18 Jun. 2003 and entitled "IEEE Standard for Information technology—Telecommunications and information exchange between systems—Local and metropolitan area networks—Specific requirements: Part 3 Carrier Sense Multiple Access with Collision Detection (CSMA/CD) Access Method and Physical Layer Specifications: Amendment: Data Terminal Equipment (DTE) Power via Media Dependent Interface (MDI)" (herein referred to as the "IEEE 802.3af standard"). The IEEE 802.3af standard is a globally applicable standard for combining the transmission of Ethernet packets with the transmission of DC-based power over the same set of wires in a single Ethernet cable. It is contemplated that Inline Power will power such PDs as Internet Protocol (IP) telephones, surveillance cameras, switching and hub equipment for the telecommunications network, biomedical sensor equipment used for identification purposes, other biomedical equipment, radio frequency identification (RFID) card and tag readers, security card readers, various types of sensors and data acquisition equipment, fire and life-safety equipment in buildings, and the like. The power is direct current, 48 Volt power available at a range of power levels from roughly 0.5 watt to about 15.4 watts in accordance with the standard. There are mechanisms within the IEEE 802.3af standard to allocate a requested amount of power. Other proprietary schemes also exist to provide a finer and more sophisticated allocation of power than that provided by the IEEE 802.3af standard while still providing basic compliance with the standard. As the standard evolves, additional power may also become available. Conventional 8-conductor type RG-45 connectors (male or female, as appropriate) are typically used on both ends of all Ethernet connections. They are wired as defined in the IEEE 802.3af standard.

FIGS. 1A, 1B and 1C are electrical schematic diagrams of three different variants of PoE as contemplated by the IEEE 802.3af standard. In FIG. 1A a data telecommunications network 10a comprises a switch or hub 12a with integral power sourcing equipment (PSE) 14a. Power from the PSE 14a is injected on the two data carrying Ethernet twisted pairs 16aa and 16ab via center-tapped transformers 18aa and 18ab. Non-data carrying Ethernet twisted pairs 16ac and 16ad are unused in this variant. The power from data carrying Ethernet twisted pairs 16aa and 16ab is conducted from center-tapped transformers 20aa and 20ab to powered device (PD) 22a for use thereby as shown. In FIG. 1B a data telecommunications network 10b comprises a switch or hub 12b with integral power sourcing equipment (PSE) 14b. Power from the PSE 14b is injected on the two non-data carrying Ethernet twisted pairs 16bc and 16bd. Data carrying Ethernet twisted pairs 16ba and 16bb are unused in this variant for power transfer. The power from non-data carrying Ethernet twisted pairs 16bc and 16bd is conducted to powered device (PD) 22b for use thereby as shown. In FIG. 1C a data telecommunications network 10c comprises a switch or hub 12c without integral power sourcing equipment (PSE). Midspan power insertion equipment 24 simply passes the data signals on the two data carrying Ethernet twisted pairs 16ca-1 and 16cb-1 to corresponding data carrying Ethernet twisted pairs 16ca-2 and 16cb-2. Power from the PSE 14c located in the midspan power insertion equipment 24 is injected on the two non-data carrying Ethernet twisted pairs 16cc-2 and 16cd-2 as shown. The power from the non-data carrying Ethernet twisted pairs 16cc-2 and 16cd-2 is conducted to powered device (PD) 22c for use thereby as shown. Note that powered end stations 26a, 26b and 26c are all the same so that they can achieve compatibility with each of the variants described above.

Turning now to FIGS. 1D and 1E, electrical schematic diagrams illustrate variants of the IEEE 802.3af standard in which 1000 BaseT communication is enabled over a four pair Ethernet cable. Inline Power may be supplied over two pair or four pair. In FIG. 1D the PD accepts power from a pair of diode bridge circuits such as full wave diode bridge rectifier type circuits well known to those of ordinary skill in the art. Power may come from either one or both of the diode bridge circuits, depending upon whether Inline Power is delivered over Pair 1-2, Pair 3-4 or Pair 1-2+Pair 3-4. In the circuit shown in FIG. 1E a PD associated with Pair 1-2 is powered by Inline Power over Pair 1-2 and a PD associated with Pair 3-4 is similarly powered. The approach used will depend upon the PD to be powered.

Inline Power is also available through techniques that are non-IEEE 802.3 standard compliant as is well known to those of ordinary skill in the art.

In order to provide regular Inline Power to a PD from a PSE it is a general requirement that two processes first be accomplished. First, a "discovery" process must be accomplished to verify that the candidate PD is, in fact, adapted to receive Inline Power. Second, a "classification" process must be accomplished to determine an amount of Inline Power to allocate to the PD, the PSE having a finite amount of Inline Power resources available for allocation to coupled PDs.

The discovery process looks for an "identity network" at the PD. The identity network is one or more electrical components, which respond in certain, predetermined ways when probed by a signal from the PSE. One of the simplest identity networks is a resistor coupled across the two pairs of common mode power/data conductors. The IEEE 802.3af standard calls for a 25,000 ohm resistor to be presented for discovery by the PD. The resistor may be present at all times or it may be switched into the circuit during the discovery process in response to discovery signals from the PSE.

The PSE applies some Inline Power (not "regular" Inline Power, i.e., reduced voltage and limited current) as the discovery signal to measure resistance across the two pairs of conductors to determine if the 25,000 ohm resistance is present. This is typically implemented as a first voltage for a first period of time and a second voltage for a second period of time, both voltages exceeding a maximum idle voltage (0-5 VDC in accordance with the IEEE 802.3af standard) which may be present on the pair of conductors during an "idle" time while regular Inline Power is not provided. The discovery signals do not enter a classification voltage range (typically about 15-20V in accordance with the IEEE 802.3af standard) but have a voltage between that range and the idle voltage range. The return currents responsive to application of the discovery signals are measured and a resistance across the two pairs of conductors is calculated. If that resistance is the identity network resistance, then the classification process may commence, otherwise the system returns to an idle condition.

In accordance with the IEEE 802.3af standard, the classification process involves applying a voltage in a classification range to the PD. The PD may use a current source to send a predetermined classification current signal back to the PSE. This classification current signal corresponds to the "class" of the PD. In the IEEE 802.3af standard as presently constituted, the classes are as set forth in Table I:

TABLE I

| Class | PSE Classification Current Range (mA) | Corresponding Inline Power Level (W) |
|---|---|---|
| 0 | 0-5 | 15.4 |
| 1 | 8-13 | 4.0 |
| 2 | 16-21 | 7.0 |
| 3 | 25-31 | 15.4 |
| 4 | 35-45 | 15.4 |

The discovery process is therefore used in order to avoid providing Inline Power (at full voltage of −48 VDC) to so-called "legacy" devices, which are not particularly adapted to receive or utilize Inline Power.

The classification process is therefore used in order to manage Inline Power resources so that available power resources can be efficiently allocated and utilized.

It may be desired to provide inline power down all four pairs in a cable. However, sometimes a un-used pair is re-routed to a separate PD via a splitter. Hence, it is desirable to ensure that all four pairs are connected to the same PD before applying power down all four pairs.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

DETAILED DESCRIPTION

Embodiments of the present invention described in the following detailed description are directed at power and data redundancy in a single wiring closet. Those of ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
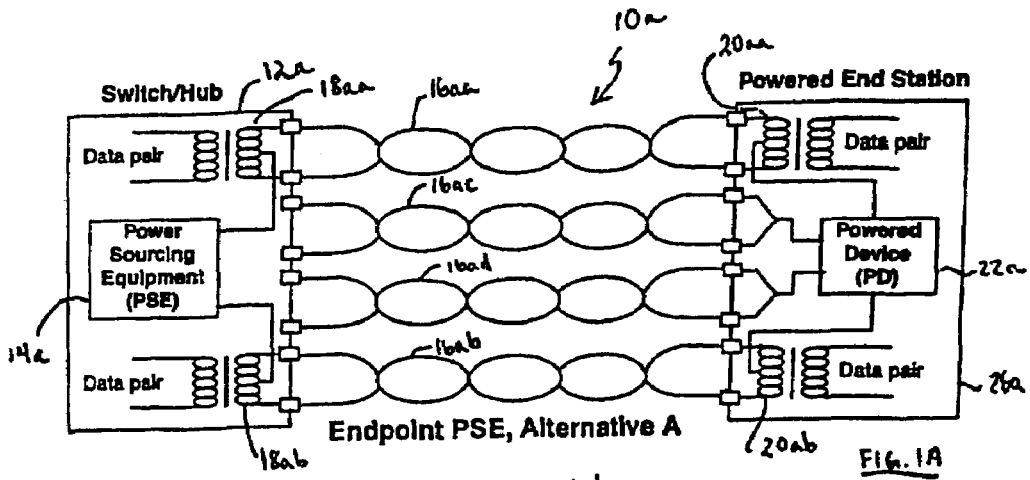
FIGS. 1A, 1B, 1C, 1D and 1E are electrical schematic diagrams of portions of data telecommunications networks in accordance with the prior art.
Figure 1B:
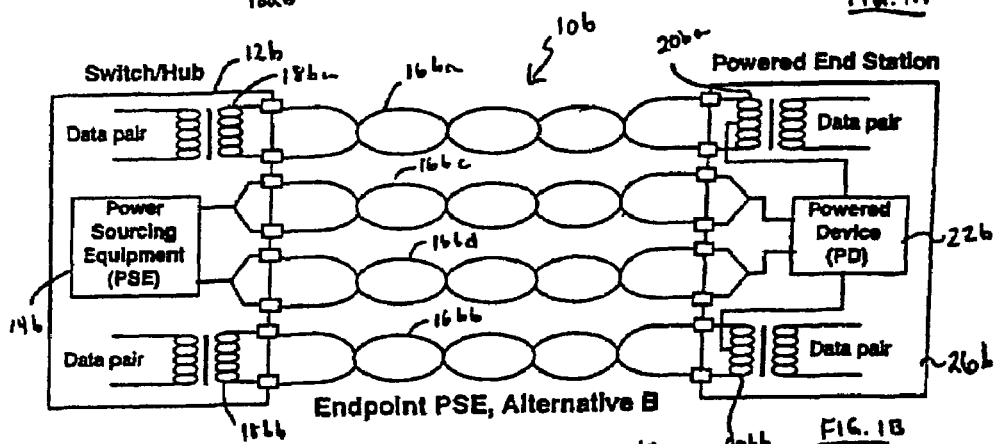
Figure 1C:
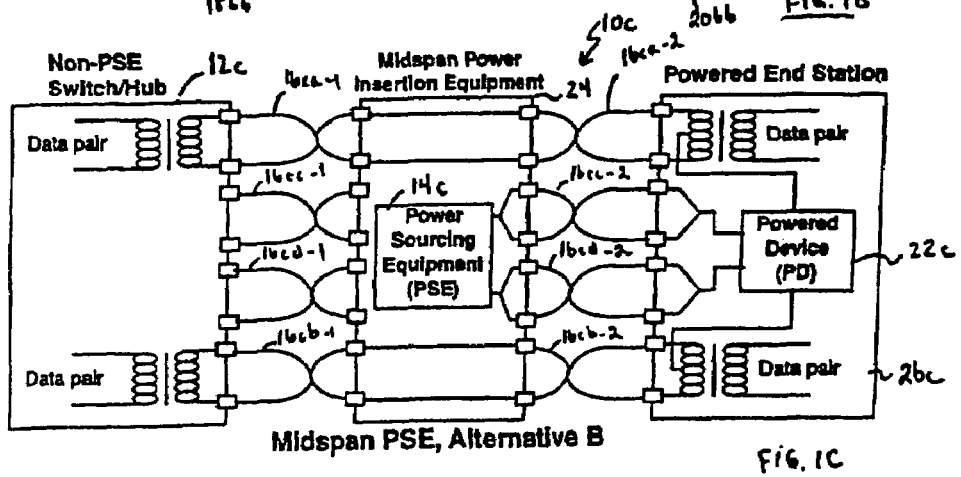
Figure 1D:
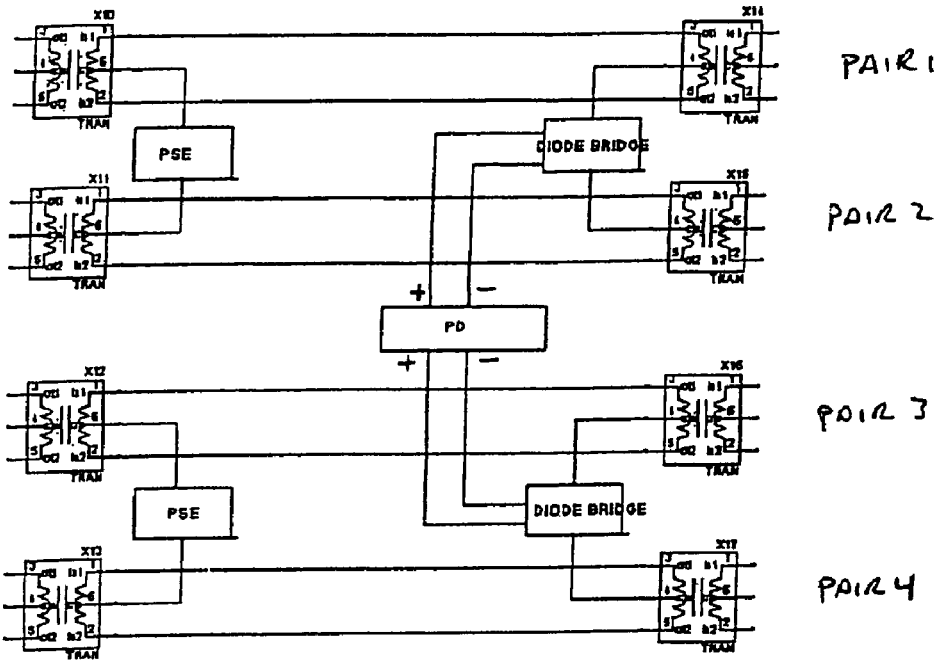
Figure 1E:
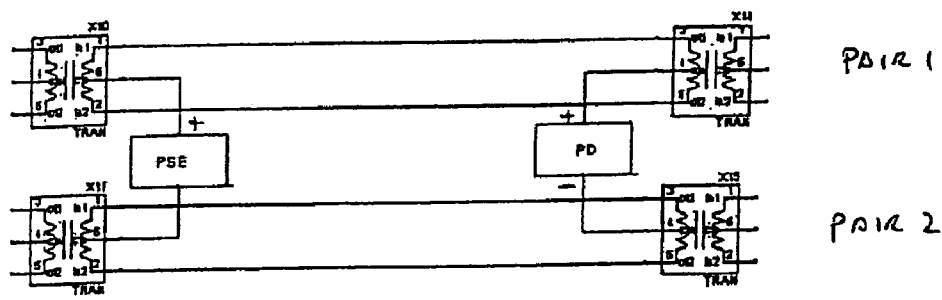
Figure 1E:
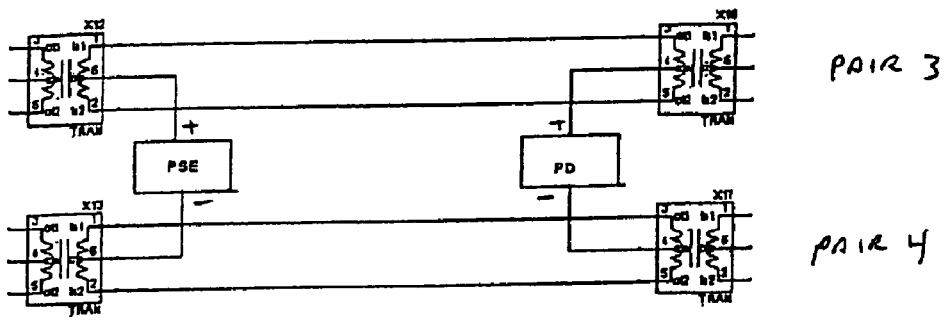
Figure 2:
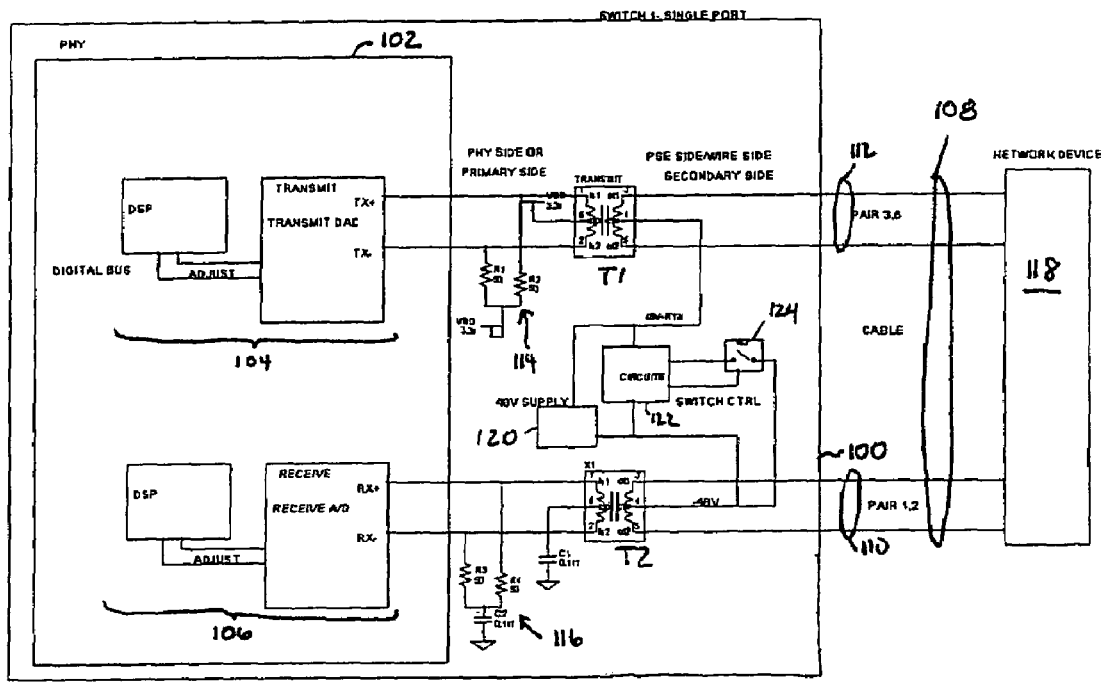
FIG. 2 is an electrical schematic diagram of a typical Ethernet 10/100 Base T connection in accordance with the prior art.

Turning now to FIG. 2 a typical 2-pair Ethernet (10 Base T, 100 Base T and 1000BT if 4-pairs were used) connection is illustrated. Box 100 encompasses the Ethernet port as it might exist in a network device such as a switch, hub, router or like device. Within port 100 is a PHY or physical layer device 102 which includes transmit circuitry 104 and receive circuitry 106. The transmit circuitry 104 interfaces to a connector such as an RJ-45 connector (not shown here) and through the connector to a cable 108 which includes at least two pairs of conductors, the Pair 1-2 (110) and the Pair 3-6 (112). The interface between the transmit circuitry 104 and the cable 108 includes a center-tapped magnetic device such as transformer T1. T1 has a PHY-side including pins 1 and 2 and center tap 6, and a wire side including pins 3 and 5 and center tap 4. The PHY side is also referred to as the primary side; the wire side is also referred to as the secondary side of the magnetic device T1. Termination circuitry 114 provides a Vdd bias (here illustrated as +3.3 VDC) to the primary of T1. The secondary of T1 is coupled to cable pair 112 that is, in turn, coupled in operation to a network device 118 which may be another hub, switch or router or a PD such as a Voice Over Internet Protocol (VOIP) telephone or other network device.

The interface between the receive circuitry 106 and the cable 108 includes a center-tapped magnetic device such as transformer T2. T2 has a PHY-side including pins 1 and 2 and center tap 6, and a wire side including pins 3 and 5 and center tap 4. The PHY side is also referred to as the primary side; the wire side is also referred to as the secondary side of the magnetic device T2. Termination circuitry 116 provides a ground bias to the primary of T2. The secondary of T2 is coupled to cable pair 110 that is, in turn, coupled in operation to a network device 118. If the pairs of conductors shown belonged to a 1000 Base T wired data telecommunications network segment then each pair would transmit and receive at the same time and all four pairs in the cable would be used.

Center tap pins 4 of T1 and T2 are coupled to inline power circuitry including a 48 VDC power supply 120 for providing Inline Power over cable 108, control circuitry 122 and switch circuitry 124.

Figure 3:
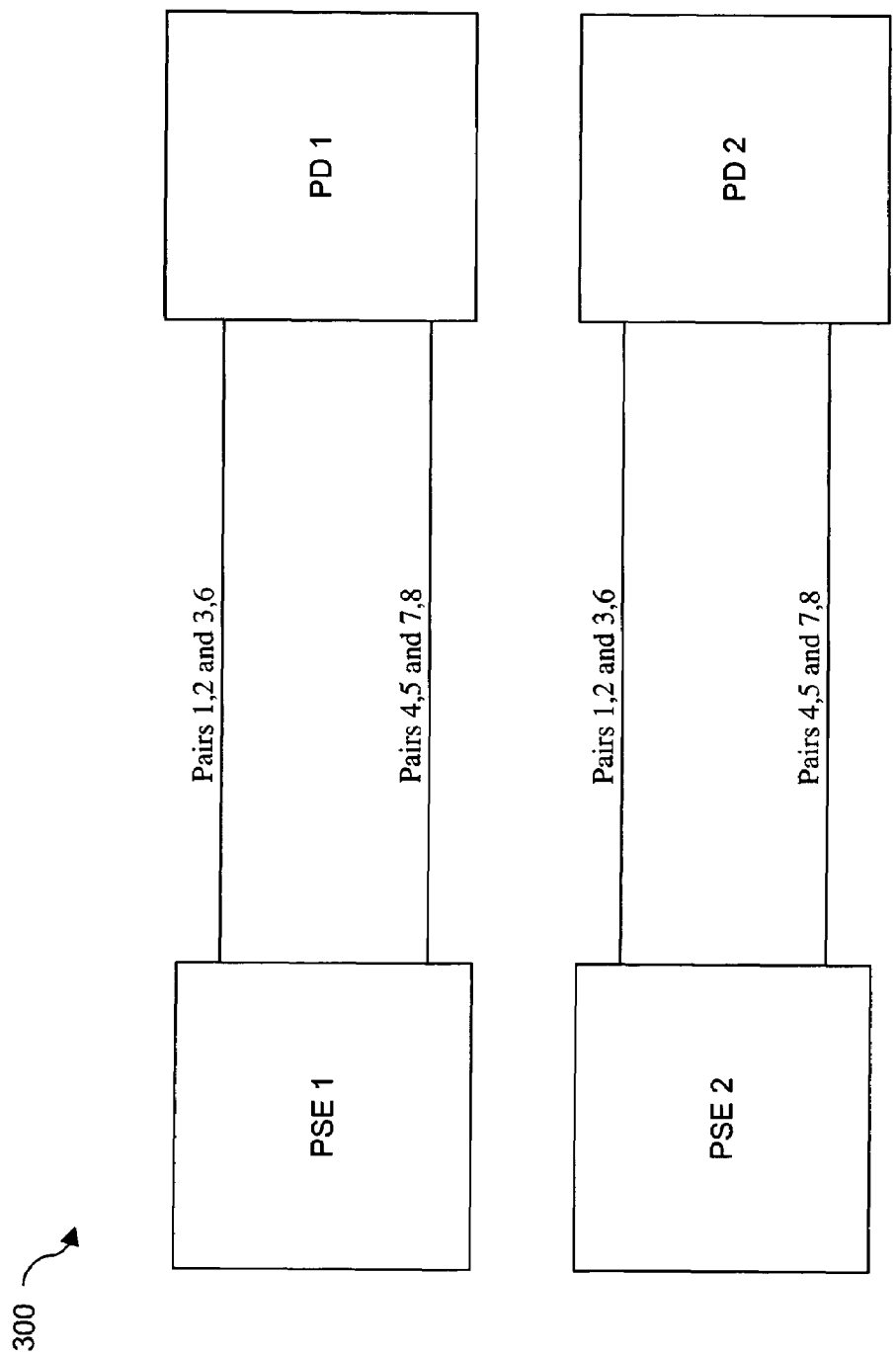
FIG. 3 is a block diagram of a pair of PSE/PD systems coupled in a 'normal' fashion as is expected in a 10/100 BaseT system.

FIG. 3 is a block diagram of a pair of PSE/PD systems coupled in a 'normal' fashion as is expected in a 10/100 BaseT system. As such, signal pairs 1,2 and 3,6 are coupled between PSE 1 and PD 1, and PSE 2 and PD 2, respectively as are unused pairs 4,5 and 7,8. Hence, in the example of FIG. 3, if power is supplied down all four pairs, power will flow from PSE 1 to PD 1, and PSE 2 to PD 2, as expected.

Figure 4A:
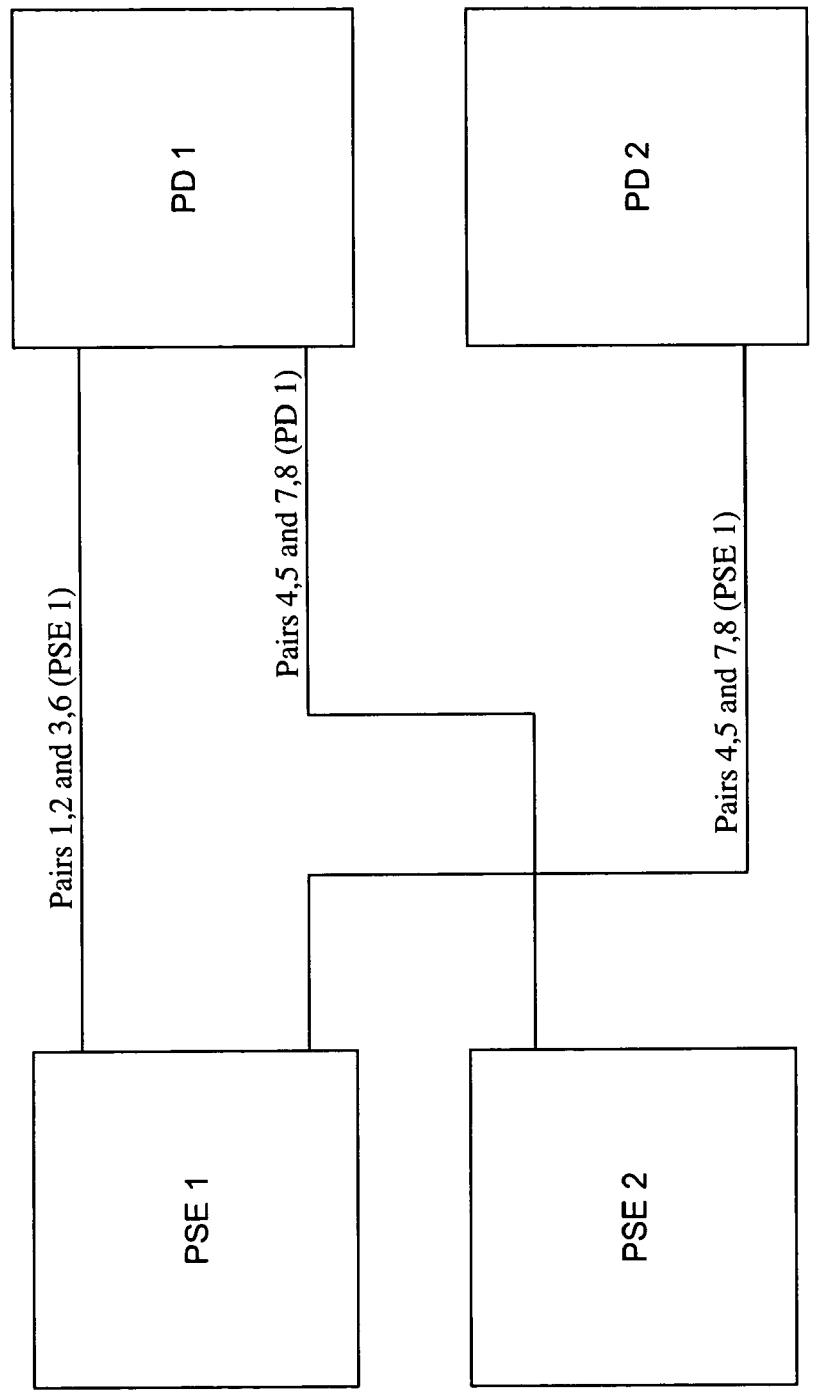
FIGS. 4A-C are block diagrams showing the systems coupled in a manners unexpected in a 10/100 BaseT system.

FIG. 4A is a diagram of a system in which the unused pairs have been re-routed to a different device. In FIG. 4A, signal pairs 1,2 and 3,6 are coupled between PSE 1 and PD 1 as expected. However, the unused pairs 4,5 and 7,8 have been connected from PSE 1 to PD 2. Likewise the unused pairs have been connected from PSE 2 to PD 1.

In the case illustrated in FIG. 4A, if inline power is supplied on all four pairs of the cable by PSE 1, inline power will unintentionally be supplied to two different devices, PD 1 via the signal pairs, and PD 2 via the unused pairs.

Figure 4B:
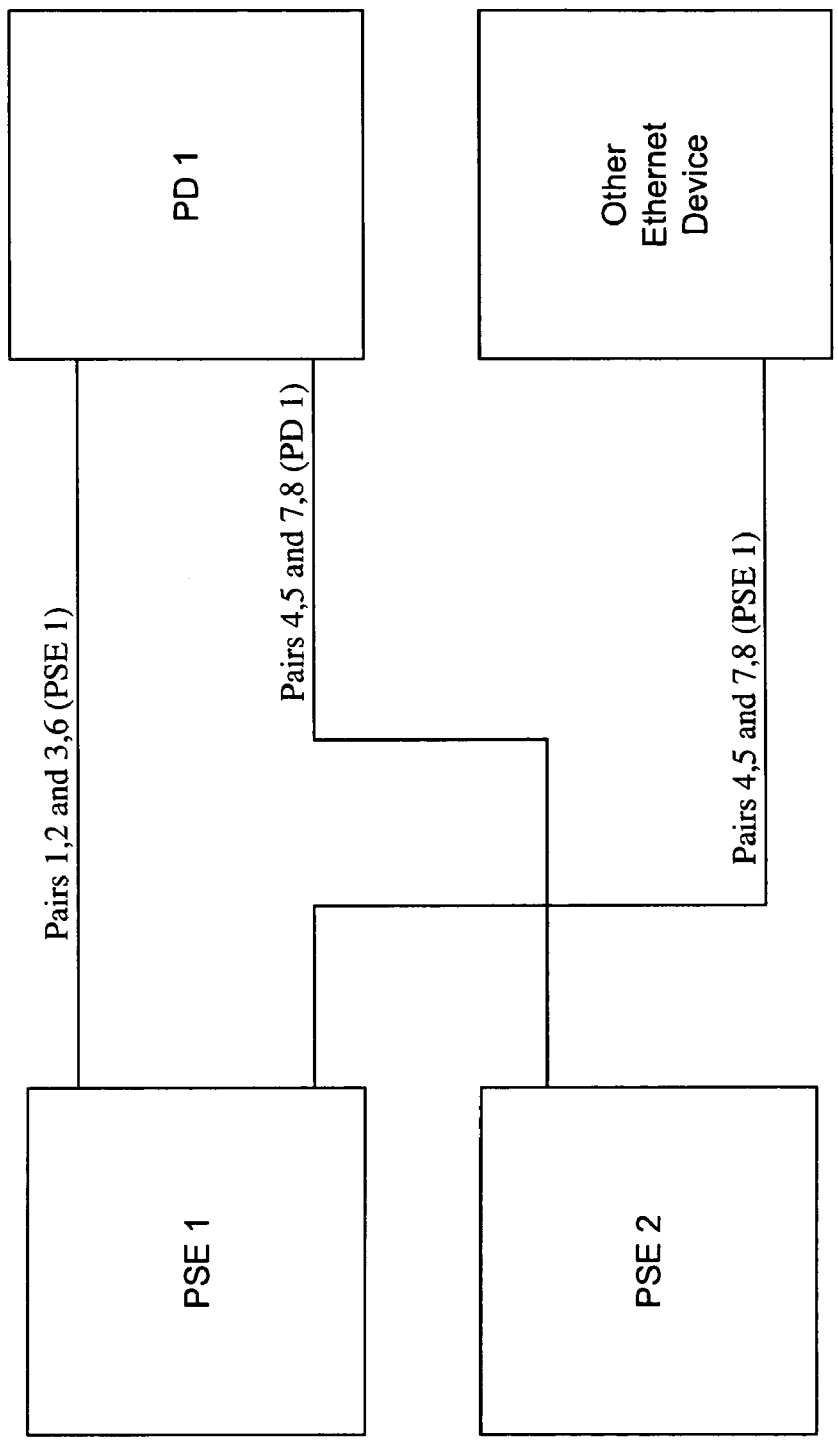

FIG. 4B illustrates an example where the unused pairs are coupled between PSE 1 and an Ethernet device other than a PD. For example, the unused pairs may be coupled to a legacy (802.3af non-compliant device) or another PSE.

Figure 4C:
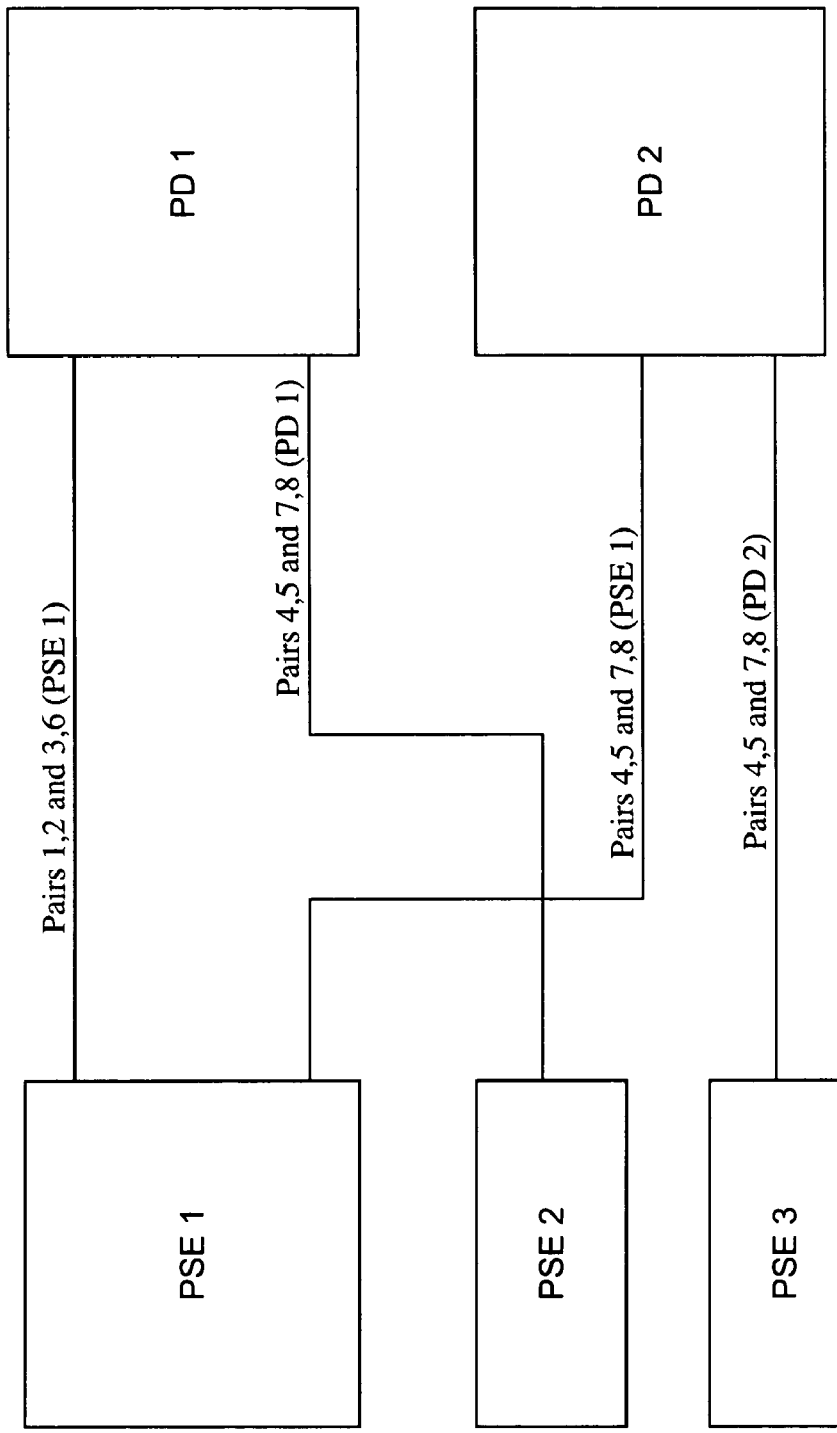

FIG. 4C illustrates a case where the unused pairs of PD 2 are coupled to yet a third device, in this case a power sourcing device PSE 3.

As will be appreciated, the cases illustrated in FIGS. 4A-C show that unintentionally supplying power to a device not compliant with the 802.3af standard may cause problems. For example, typically a single 25 k Ohm resistor is used within a single Ethernet connector, and many discovery routines may assume that discovering a 25 k Ohm signature on the signal pairs indicates a successful discovery routine. If the discovery process assumes that all four pairs are coupled to the same device, the discovery process may detect the signature resistance in the signal pairs and turn on power to all four pairs, possibly damaging a legacy Ethernet device.

To prevent this, the present disclosure provides a method for determining whether all four pairs of an Ethernet connection are coupled to the same device. The present disclosure provides a modification to the 802.3af discovery process in which additional sensing signals are injected in the pairs to detect whether all four pairs terminate in the same device. The disclosed process may be employed after a successful 802.3af discovery of both the signal and unused pairs. Only if it is determined that both pairs are coupled to the same device is inline power delivered down all four pairs.

The advantages of insuring that all pairs go to the same PD helps in reducing the cost of the PSE, AC disconnect, and or Accurate DC sensing circuitry required on every 2 pairs in the prior art. The present disclosure may utilize circuitry designed for one pair only, thus reducing complexity and cost.

Figure 5:
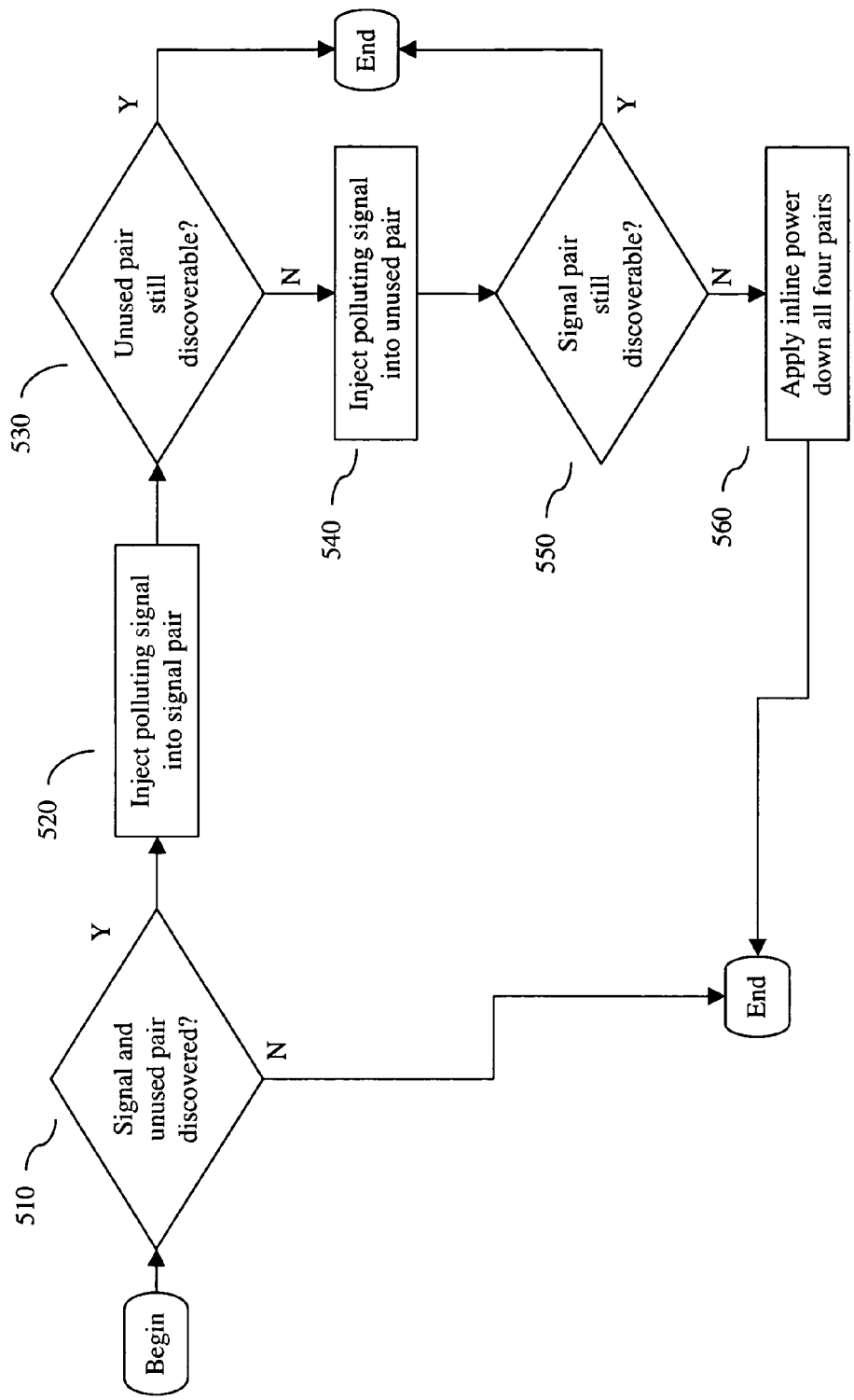
FIG. 5 is a flow diagram of a method for determining whether all pairs of an Ethernet connection terminate at the same device.

FIG. 5 is a flow diagram of a method for determining whether all pairs of an Ethernet connection terminate at the same device. The process of FIG. 5 begins in query 510, where the signal and unused pairs of an Ethernet connection are discovered using the 802.3af process. Only if both pairs are discoverable does the process continue; if either pair cannot be successfully discovered, then the process ends as one of the pairs is unterminated or connected to a legacy Ethernet device.

In the case that a PD requires dual 25 k resistors (one on each sets of pairs 1,2 and 3,6 and 4,5 and 7,8), power FET switches and supporting circuitry, the PD may include an internal circuit that would allow this scheme to work properly, i.e., an additional internal transistor switch and supporting circuitry to help the disclosed polluting approach succeed. The advantages of this scheme, is that it could execute the 25 k detection in the PSE on one pair at a time and help mux or re-use the electronics already existing in the PSE, lowering the cost of the PSE circuitry.

If both pairs are discovered in query 510, then the process moves to act 520, where a polluting signal is applied to the signal pair while the 802.3af discovery signal is still being applied. As will be described in more detail below, the polluting signal of this disclosure is preferably an additional applied voltage source intended to "pollute" the discovery process and cause an intentional failure in the discovery process of the other pair, i.e., the unused pair in this instance.

Once the polluting signal has been applied to the signal pair in act 520, the process moves to query 530, where the discovery process is applied to the unused pair. As will now be more fully appreciated, if the two pairs are coupled to the same device, then polluting the signal on one pair will cause a discovery failure on the other. In this case, injecting a polluting signal on the signal pair should force a failure on the unused pair if they are indeed connected to the same device. Hence, the process only proceeds if the discovery process fails on the unused pair.

If the discovery of the unused pair fails in query 530 the polluting/discovery process is reversed and performed on the other pair. Thus, in act 540 a polluting signal is applied to the unused pair, and in query 550 it is determined if the discovery process has failed on the signal pair.

As can now be appreciated, inline power is only applied to all four pairs in act 560 if the polluting signal is successful in causing a discovery failure on both the signal and unused pairs. Injecting a polluting signal into one pair and sensing a discovery failure in the other pair, and then repeating the process in the opposite pairs, therefore ensures that another device such as a PSE or midspan device is not supplying an unintended polluting signal on one pair resulting in a false failure.

Figure 6A:
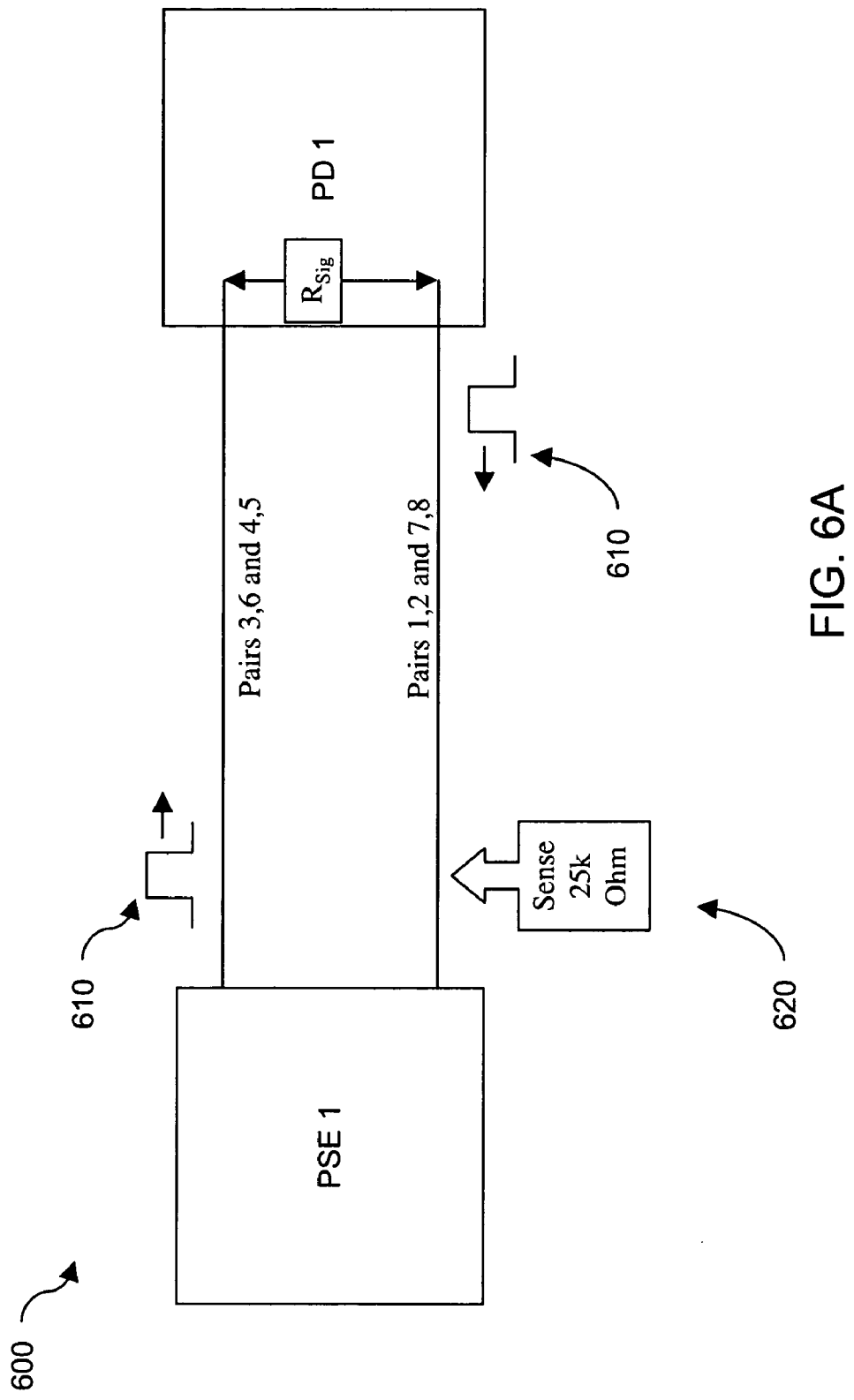
FIGS. 6A and 6B are conceptual block diagrams illustrating the process of determining whether all four pairs of an Ethernet connection are coupled to the same device in accordance with this disclosure.
Figure 6B:
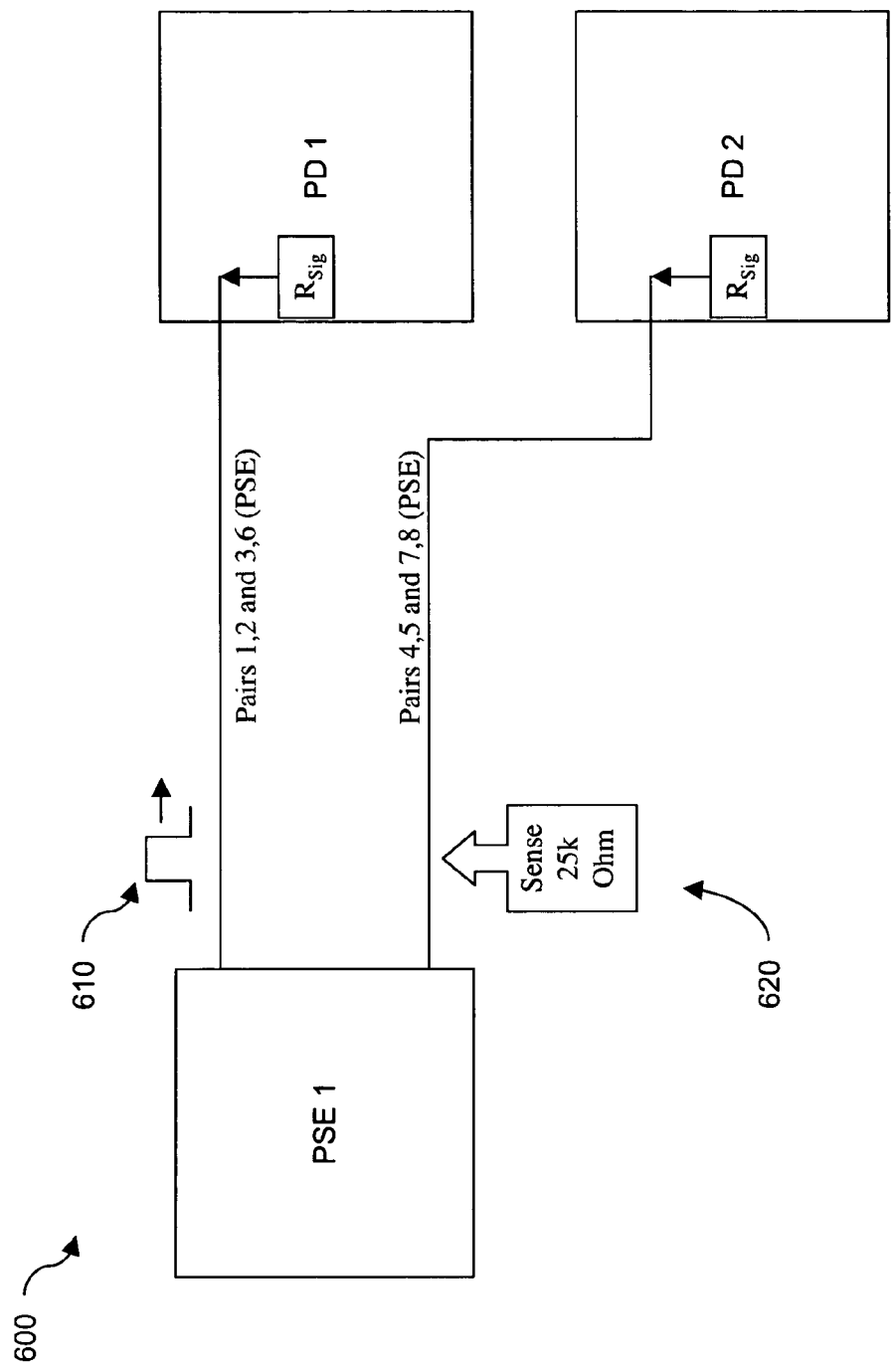

FIGS. 6A and 6B are conceptual block diagrams illustrating the process of determining whether all four pairs of an Ethernet connection are coupled to the same device in accordance with this disclosure. FIG. 6A shows a system 600 coupled in an ideal manner, with both signal pairs 1,2 and 3,6 coupled to the PD 1, and both unused pairs 4,5 and 7,8 also coupled to the PD 1. Within PD 1, a signature resistance (RSig) is coupled to both the signal and unused pairs for providing the resistance signature for the 802.3af discovery process.

FIG. 6A shows a polluting signal 610 being applied to the signal pairs. In one embodiment, the polluting signal comprises a voltage of a sufficient amount to cause an intentional failure of the 802.3af discovery routine. In one preferred embodiment, the polluting signal comprises a voltage applied from a different source than the discovery detection source to insure that the 25 k signature resistance can not be found. In a further preferred embodiment, the pollution signal comprises a 10V DC signal. It is contemplated that any voltage or pulse may be used that results in the 25 k signature not being easily discovered. In preferred embodiments, the voltage level of the polluting signal may range between approximately 6 v and 13 v. The voltage level may be kept below 20 v to prevent damage to power FETs by ensuring that a PD is not on for the duration of the detection period.

The polluting signal of this disclosure need not only comprise a signal applied directly to the conductor pairs. In a further preferred embodiment, it may be desired to block the PSE from ever powering a device, for example when a device is self-powered. In such cases, the 25 k signature resistance may be changed so as to impede the discovery process of that same 25 k signature resistance.

As will now be appreciated, since all pairs in FIG. 6A are coupled to the same PD, the pollution signal 610 will also appear on unused pairs 4,5 and 7,8. Accordingly, when the 25 k resistance signature is sensed at point 620, the voltage and current sensed will be distorted by the polluting signal 610, resulting in a failure as the proper 25 k Ohm resistance will not be sensed.

Likewise, if the process is reversed, i.e., the polluting signal is applied to the unused pairs 4,5, and 7,8, and the 25 k signature is sensed on the signal pairs 1,2 and 3,6, the result will be the same, therefore verifying that both pairs are indeed coupled to the same PD.

FIG. 6B is a diagram showing the result of the disclosed method when the unused pairs 4,5 and 7,8 are coupled to a different PD, namely PD 2.

In this case, the polluting signal 610 applied to the signal pairs will not be coupled onto the unused pairs, as the unused pairs are coupled to PD 2, and not to PD 1 in this example. Rather, when the 25 k resistance signature is sensed at point 620, the 25 k Ohm resistance of PD 2 will be correctly discovered. This will result in a successful discovery process of the unused pairs. Since the polluting signal on the signal pair did not affect the 25 k resistance signature of the unused pair, we can conclude that the unused pairs have been coupled to a different device than the signal pairs, and hence inline power will not be delivered down all four pairs.

Figure 7:
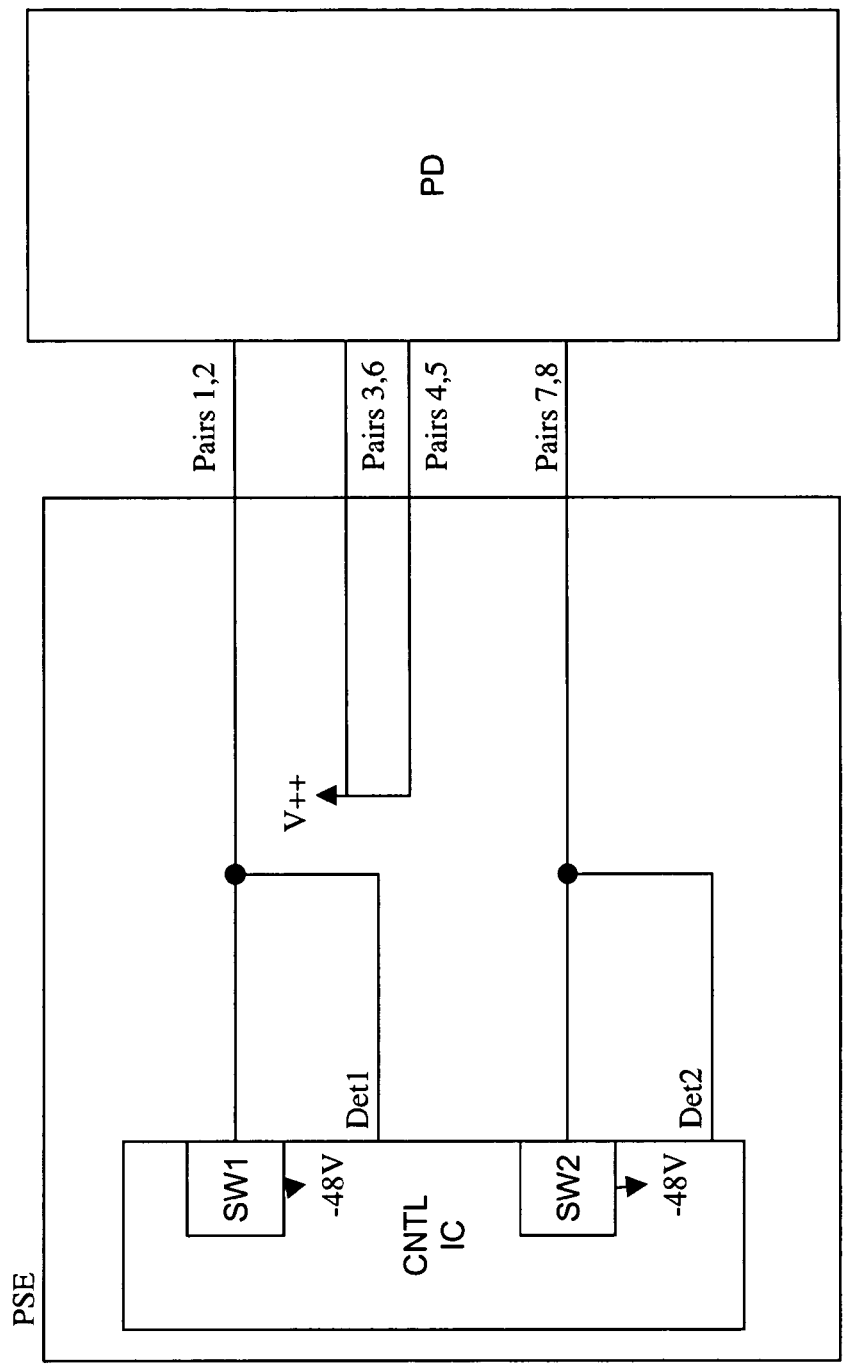
FIG. 7, a schematic diagram of exemplary circuitry for carrying out disclosed algorithms in accordance with this disclosure is shown.

Referring now to FIG. 7, a schematic diagram of exemplary circuitry for carrying out disclosed algorithms is shown. The system of FIG. 7 includes a PSE coupled to a PD in the routine manner as described above. In accordance with the IEEE 802.3af standard, an inline power controller IC is provided. Two power switches (noted as SW1 and SW 2, respectively), typically power transistors, are coupled to the pairs to be powered (pairs 1,2 and 7,8), and the switches are also coupled to the −48V power source of the PSE. The power switches typically reside within the control IC, but may be external to the IC and controlled through control lines coupled to the gate of the switching transistor.

To perform the IEEE PD discovery routine, two detection lines, Det1 and Det2, are coupled to the powered pairs 1,2 and 7,8, respectively. As will be appreciated, the detection lines are coupled to the pairs in front of the power switches, as the detection routine is performed prior to the power switches being turned on.

It is contemplated that the discovery routine and the disclosed algorithm may be performed by a conventional inline power IC that has additional programming to perform the disclosed routine. In one embodiment, the existing detection lines may be employed to detect whether all four pairs are coupled to a single device. To provide the additional +10V polluting signal used herein, it is contemplated that the existing 48V power source already existing in the inline power controller and host PSE may be employed.

In operation, it is assumed that the standard discovery procedure has been performed. As described above, it is desired to verify the connection by polluting the signature of one pair while performing a discovery process on the other, then repeating the procedure for the opposite pairs. Thus, in a first test, pair 1,2 may be detected through the Det1 detection line, while the polluting signal is output to pair 7,8 through the Det2 line. The process may then be performed in a reverse fashion, with pair 1,2 receiving the polluting signal through the Det1 line, while discovery is performed on pair 7,8 through the Det2 detection line. Hence, the pollution and discovery routine of this disclosure may be implemented in existing hardware with only the need for minor enhancements.

Referring briefly to FIG. 4C, the example illustrated therein presents a particularly challenging problem. As will be appreciated by those of ordinary skill in the art, when a cable is coupled to multiple devices, a possibility exists that discovery signals may be present from multiple sources, and that a single PSE may see duplicate 25 k Ohm resistance signatures. Embodiments are now presented to overcome these challenges.

In one embodiment, rather than provide an external signal to pollute the resistance signature, a portion of the existing discovery signal is bleeded off through the other powered pair to pollute the signature. In a preferred embodiment, approximately half of the discovery current is routed through another pair, resulting in polluting the 25 k Ohm resistor of the PD such that it is sensed as having double the 25 k Ohm signature value to the attached PSE trying to exercise the polluting algorithm.

Figure 8:
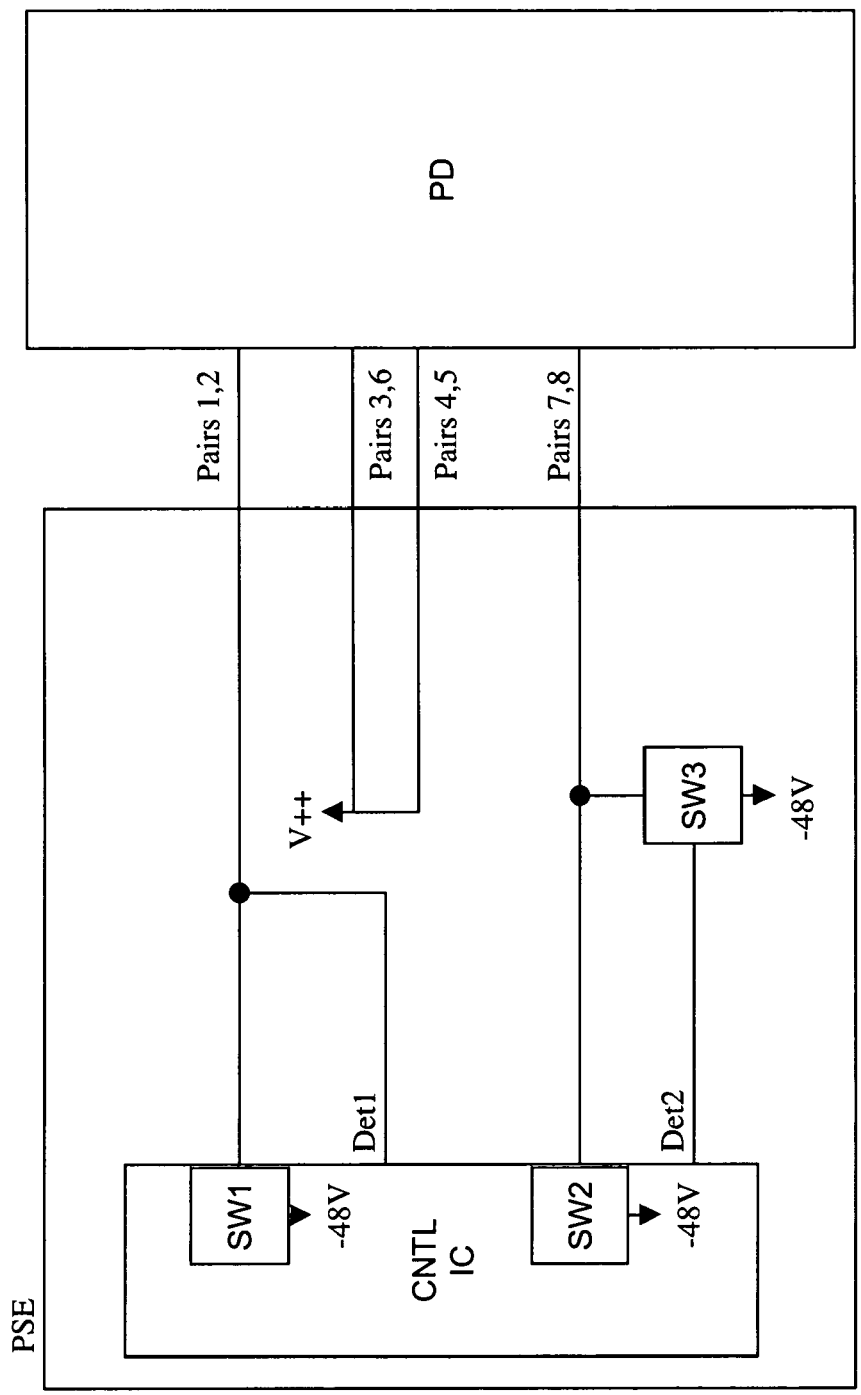
FIG. 8, a schematic diagram of exemplary circuitry for carrying out disclosed algorithms in accordance with this disclosure is shown.

Referring now to FIG. 8, an additional switch S3, such as a transistor, is added to the structure of FIG. 7 to pollute the signature resistance. To accomplish this, the switch S3 is engaged during the algorithm of this disclosure to provide an additional path for the signal flowing through the 25 k Ohm signature resistor of the PD. It is contemplated that this additional switch may operate under the control of the inline power controller IC.

As will be appreciated by those of ordinary skill in the art, during the normal IEEE discovery routine, pair 7,8 will be placed in a high impedance state during the discovery of pair 1,2. Thus, no current will normally flow on pair 7,8 during the discovery process for pair 1,2. By switching in pair 7,8 with S3 during the discovery process for pair 1,2, it is contemplated that approximately half of the detection current will now flow through pair 7,8, resulting in the sensing on pair 1,2 of half the expected current. This will result in a calculation leading to the conclusion that the signature resistance is approximately 50 k Ohms, and thus the discovery process will fail.

As will now be appreciated, the above scenario will only occur if all pairs are coupled to the same PD, as SW3 will have no effect if pair 7,8 is coupled to a different PD. Hence, this additional discovery process requires no additional signal generation, and is yet another manner in which to verify that all pairs are coupled to the same device.

Also, in some configurations (such as the one presented in FIG. 4C or similar situations) the crossing of two of the pairs from two different PSEs to two different PDs may cause the disclosed scheme to be 'fooled' and come to the wrong conclusion due to the detection process being synchronous while potentially having multiple detection signals present that may be both in-phase and out of phase among the all attached PSEs sharing connections to a single 25 k resistor in each PD.

This condition may be alleviated by having the PSE peak-detect the 'loaded' detect signal and observe its phase relationship relative to its own detection (synchronous) signal to insure that cross-detection signals from other actively detecting PSE's do not cause the polluting algorithm to fail. These extra measurements or checks become apparent from the characteristics of a PSEs detection scheme (voltage and current relationships) as compared in the case of FIG. 4C vs. the case of FIG. 6A.

In FIG. 6A, there is a single 25 k Ohm signature resistor that is shared across all pairs when all the pairs are inside the same PD. However, each of the PDs of FIG. 4C has its own signature resistor. Hence, it is contemplated that when observing a 'non-loaded' detect signal that is emanating from a different PD, it will be higher in voltage as a result of less loading.

Accordingly, in one embodiment, the PSE may peak detect the detection signals that are in phase with its detection scheme, and look for a detection signal that is below approximately 7V as a result of the two diode-drops required to traverse the current loop formed by its connected PD. Any detection signals that are still reading near 10V may be discarded as false readings provided by another device.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

What is claimed is:

1. A method for determining that all conductors of an Ethernet connection are connected to a same powered device (PD) comprising:
    determining that a set of conductor pairs comprising: a signal conductor pair and an unused conductor pair of the Ethernet connection are coupled to a valid PD according to a discovery process;
    polluting a resistance signature of a first one of said set of conductor pairs;
    performing the discovery process on an other one of said set of conductor pairs; and
    if the discovery process fails on said other one of said set of conductor pairs, then determining that both of said set of conductor pairs are coupled to a same PD.

2. The method of claim 1, wherein said act of polluting said resistance signature comprises injecting a polluting signal into a one of said set of conductor pairs.

3. The method of claim 2, wherein said polluting signal comprises a voltage of a sufficient amount to cause an intentional failure of an IEEE 802.3af discovery process on the one of said set of conductor pairs into which the polluting signal is injected.

4. The method of claim 3, wherein said polluting signal comprises a voltage applied from a different source than a discovery detection source.

5. The method of claim 3, wherein said polluting signal comprises a 10V DC signal.

6. The method of claim 1, wherein said act of polluting said resistance signature comprises causing a sensed current of a detection signal used in said discovery process to be measured at approximately half of an expected value.

7. The method of claim 1, further comprising:
    peak detecting detection signals, and
    disregarding detection signals that are asynchronous and are above a predetermined voltage level.

8. An apparatus for determining that all conductors of an Ethernet connection are connected to a same powered device (PD) comprising:
    means for determining that both a signal conductor pair and an unused conductor pairs of the Ethernet connection are coupled to a valid PD according to a discovery process;
    means for polluting a resistance signature of a first one of a set of conductor pairs comprising the signal conductor pair and the unused conductor pair;
    means for performing the discovery process on an other one of said set of conductor pairs; and
    if the discovery process fails on said other one of said set of conductor pairs, then determining that both of said set of conductor pairs are coupled to a same PD.

9. The apparatus of claim 8, wherein said means for polluting the resistance signature comprises:
    means for injecting a polluting signal into a one of said set of conductor pairs.

10. The apparatus of claim 9, wherein said polluting signal comprises a voltage of a sufficient amount to cause an intentional failure of an IEEE 802.3af discovery process on the one of the set of conductive pairs into which the polluting signal is injected.

11. The apparatus of claim 10, further comprising means for applying said voltage applied from a different source than a discovery detection source.

12. The apparatus of claim 10, wherein said polluting signal comprises a 10V DC signal.

13. The apparatus of claim 8, further comprising means for causing the sensed current of the detection signal used in said discovery process to be measured at approximately half of an expected value.

14. The apparatus of claim 8, further comprising means for peak detecting detection signals and disregarding detection signals that are asynchronous and are above a predetermined voltage level.

15. An Ethernet-compliant Power Source Equipment (PSE) for determining that all conductors of an Ethernet connection are connected to a same powered device (PD) comprising:
    an inline power controller circuitry, said inline power controller circuitry being configured to:
    determine that both a signal conductor pair and an unused conductor pairs of the Ethernet connection are coupled to a valid PD according to a discovery process;
    pollute a resistance signature of a first one of a set of conductor pairs comprising the signal conductor pair and the unused conductor pair;
    perform the discovery process on a second one of said set of conductor pairs; and
    if the discovery process fails on said second one of said set of conductor pairs, then determine that both of said set of conductor pairs are coupled to a same PD.

16. The PSE of claim 15, wherein said circuitry configured to pollute the resistance signature is configured to inject a polluting signal into a one of said set of conductor pairs.

17. The PSE of claim 16, wherein said polluting signal comprises a voltage of a sufficient amount to cause an intentional failure of an IEEE 802.3af discovery process on a one of the set of conductor pairs into which the signal is injected.

18. The PSE of claim 17, wherein said PSE is further configured to apply said voltage from a different source than the discovery detection source.

19. The PSE of claim 17, wherein said polluting signal comprises a 10V DC signal.

20. The PSE of claim 15, wherein said PSE is further configured to cause a sensed current of the detection signal used in said discovery process to be measured at approximately half of an expected value.

21. The PSE of claim 15, wherein said PSE is further configured to:
  peak detect detection signals, and
  disregard detection signals that are asynchronous and are above a predetermined voltage level.

22. An integrated circuit device programmed to perform a method for determining that all conductors of an Ethernet connection are connected to a same powered device (PD), said method comprising:
  determining that a signal conductor pair and an unused conductor pair of the Ethernet connection are coupled to a valid PD according to a discovery process;
  polluting a resistance signature of a first one of a set of conductor pairs comprising the signal conductor pair and the unused conductor pair;
  performing the discovery process on an other one of said set of conductor pairs; and
  if the discovery process fails on said other one of said set of conductor pairs, then determining that both of said set of conductor pairs are coupled to a same PD.

23. The device of claim 22, wherein said act of polluting said resistance signature comprises injecting a polluting signal into a one of said set of conductor pairs.

24. The device of claim 23, wherein said polluting signal comprises a voltage of a sufficient amount to cause an intentional failure of an IEEE 802.3af discovery process on the one of said set of conductor pairs into which the polluting signal is injected.

25. The device of claim 24, wherein said polluting signal comprises a voltage applied from a different source than a discovery detection source.

26. The device of claim 24, wherein said polluting signal comprises a 10V DC signal.

27. The device of claim 22, wherein said act of polluting said resistance signature comprises causing a sensed current of the detection signal used in said discovery process to be measured at approximately half of an expected value.

28. The device of claim 22, wherein said method further comprises:
  detecting peak detection signals, and
  disregarding detection signals that are asynchronous and are above a predetermined voltage level.

\* \* \* \* \*

UNITED STATES PATENT AND TRADEMARK OFFICE
CERTIFICATE OF CORRECTION

PATENT NO. : 7,693,076 B2  Page 1 of 1
APPLICATION NO. : 11/058963
DATED : April 6, 2010
INVENTOR(S) : Roger Karam It is certified that error appears in the above-identified patent and that said Letters Patent is hereby corrected as shown below:

In Claim 8, at Column 10, Line 2, please delete "pairs" and insert --pair-- therefor.

In Claim 15, at Column 10, Line 42, please delete "pairs" and insert --pair-- therefor.

Signed and Sealed this

Thirty-first Day of August, 2010

David J. Kappos
*Director of the United States Patent and Trademark Office*